United States Patent [19]

Kiyotomo

[11] Patent Number: 4,555,086
[45] Date of Patent: Nov. 26, 1985

[54] PLASTIC MOLDING APPARATUS

[75] Inventor: Tsutomu Kiyotomo, Yokohama, Japan

[73] Assignee: Tokyo Shibaura Denki Kabushiki Kaisha, Kawasaki, Japan

[21] Appl. No.: 569,602

[22] Filed: Jan. 10, 1984

[30] Foreign Application Priority Data

Jan. 13, 1983 [JP] Japan .................... 58-3823

[51] Int. Cl.[4] .................... B29C 1/00; B29C 7/00; B29D 3/00; B29F 1/14
[52] U.S. Cl. ................................ 249/67; 425/116; 425/185; 425/556; 425/444
[58] Field of Search ............. 425/116, 117, 125, 543, 425/547, 548, 554, 556, 577, DIG. 13, 444, 182, 185, 190; 264/272.14; 249/67, 68, 78, 79

[56] References Cited

U.S. PATENT DOCUMENTS

| | | | |
|---|---|---|---|
| 1,992,314 | 2/1935 | Laussucq | 425/125 |
| 2,571,766 | 10/1951 | Saulino | 425/556 |
| 2,582,891 | 1/1952 | Strauss | 425/556 |
| 2,923,976 | 2/1960 | Strauss | 425/556 |
| 3,040,378 | 6/1962 | Rodgers et al. | 425/556 |
| 3,317,961 | 5/1967 | Drevalas et al. | 425/577 |
| 3,696,507 | 10/1972 | Unger et al. | 425/117 |
| 4,124,352 | 11/1978 | Pasch | 425/556 |
| 4,330,257 | 5/1982 | Rees et al. | 425/556 |
| 4,370,122 | 1/1983 | Daniels et al. | 425/548 |

FOREIGN PATENT DOCUMENTS

| | | | |
|---|---|---|---|
| 682964 | 3/1964 | Canada | 425/556 |
| 47-3010 | 1/1972 | Japan | 425/556 |
| WO82/02625 | 8/1982 | PCT Int'l Appl. | 264/272.14 |

OTHER PUBLICATIONS

Japanese Patent Publication (KOKOKU), No. 57-59666, Dec. 15, 1982.

Primary Examiner—Willard E. Hoag
Attorney, Agent, or Firm—Finnegan, Henderson, Farabow, Garrett & Dunner

[57] ABSTRACT

A plastic molding apparatus for molding a semiconductor element with a plastic by using transfer molds which comprising upper and lower heater plates, lower and upper molds disposed between the upper and lower heater plates, a first lower ejector plate disposed below the low heater plate, a second lower ejector plate disposed between the lower heater plate and the lower mold and connected to the first lower ejector plate through rods, lower ejector pins mounted on the second lower ejector plate capable of extending into mold cavity and a device for controlling the movement of the second lower ejector plate.

7 Claims, 4 Drawing Figures

PLASTIC MOLDING APPARATUS

BACKGROUND OF THE INVENTION (1) Field of the Invention

The present invention relates to a plastic molding apparatus for packaging a semiconductor device.

(2) Description of the Prior Art

A conventional plastic molding apparatus for molding a semiconductor device is exemplified in FIG. 1.

Referring to FIG. 1, reference numeral 1 denotes a lower half. The lower half 1 has a lower heater plate 3b provided with a plurality of through holes 2b. A lower mold 4b is disposed on the upper surface of the heater plate 3b. A plurality of bores 5b which respectively communicate with the through holes 2b are formed in the lower mold 4b. A plurality of openings or mold cavities 6b are formed in the surface of the lower mold 4b so as to respectively correspond to the bores 5b. A lower insulator 8b is disposed through a frame-like lower spacer 7b on the lower surface of the lower heater plate 3b. A lower ejector plate 11b having lower ejector pins 10b respectively corresponding to the through holes 2b is housed in a space 9b defined by the heater plate 3b, the heat insulator 8b and the spacer 7b. The ejector pins 10b are inserted in the through holes 2b and the bores 5b to be vertically movable therein. The upper surface of the ejector plate 11b is coupled to the lower surface of the heater plate 3b via a coil spring (not shown). An upper push rod (not shown) extends downward from an upper heater plate of an upper half (to be described later) and abuts against the upper surface of the lower ejector plate 11b. The upper push rod serves to urge the ejector plate 11b against the biasing force of the coil spring.

Reference numeral 12 denotes an upper half which is vertically movable relative to the lower half 1. An upper heater plate 3a having a plurality of through holes 2a is disposed in the upper half 12 so as to oppose the lower heater plate 3b. An upper mold 4a is supported below the heater plate 3a.

A plurality of bores 5a which respectively communicate with the through holes 2a are formed in the upper mold 4a. A plurality of openings or mold cavities 6a are formed in the surface of the upper mold 4a so as to respectively correspond to the bores 5a. An upper insulator 8a is disposed through a frame-like spacer 7a on the upper surface of the heater plate 3a. An upper ejector plate 11a having upper ejector pins 10a respectively corresponding to the through holes 2a is housed in a space 9a defined by the heater plate 3a, the heat insulator 8a and the spacer 7a. The ejector pins 10a are inserted in the through holes 2a and the bores 5a to be vertically movable therein. The lower surface of the ejector plate 11a is coupled to the upper surface of the heater plate 3a via a coil spring (not shown). A lower push rod (not shown) extends upward from the lower heater plate 3b of the lower half (as described above) and abuts against the lower surface of the upper ejector plate 11a. The lower push rod serves to urge the ejector plate 11a against the biasing force of the coil spring.

Pots, runners and gates (not shown) are disposed between the upper mold 4a and the lower mold 4b to serve to inject a plastic material into the openings 6b and 6a.

The operation of the plastic molding apparatus shown in FIG. 1 will be described.

A lead frame 13 with semiconductor elements mounted thereon is set in cavities of the lower mold 4b of the lower half 1.

When the upper half 12 is moved downward, the upper push rod urges and moves the lower ejector plate 11b downward against the biasing force of the coil spring for coupling the lower heater plate 3a and the lower ejector plate 11b. The lower ejector pins 10b are also moved downward. At the same time, the lower push rod urges and moves the upper ejector plate 11a upward against the biasing force of the coil spring for coupling the upper heater plate 3a and the upper ejector plate 11a, so that the upper ejector pins 10a are also moved upward. As a result, mold clamping is performed.

A plastic material is injected into the cavities through the pots, runners and gates to seal the semiconductor elements (not shown) of the lead frame 13 by plastic layers 14.

Thereafter, the upper half 12 is separated from the lower half 1, the urging force acting on the lower ejector plate 11b is released, and the lower ejector plate 11b is moved upward by the biasing force of the coil spring coupled between the lower heater plate 3b and the lower ejector plate 11b. The lower ejector pins 10b inserted in the through holes 2b and the bores 5b extend upward from the bottom surfaces of the openings 6b of the lower mold 4b. At the same time, the urging force acting on the upper ejector plate 11a by means of the lower push rod is released, and the upper ejector plate 11a is moved downward by the biasing force of the coil spring coupled between the upper heater plate 3a and the upper ejector plate 11a. The upper ejector pins 10a inserted in the through holes 2a and the bores 5a extend downward from the bottom surfaces of the openings 6a of the upper mold 4a. As a result, the lead frame 13 is released from the upper and lower halves 12 and 1.

However, in the plastic molding apparatus molding apparatus described above, the through holes 2b and 2a of the lower and upper heater plates 3b and 3a respectively communicate with the bores 5b and 5a of the lower and upper molds 4b and 4a. The lower and upper ejector pins 10b and 10a mounted on the lower and upper ejector plates 11b and 11a are vertically movable in the through holes 2b and 2a and the bores 5b and 5a, respectively. Therefore, when the outer dimensions of the products and pitches of products in the lead frame 13 change in accordance with different types of products, the shapes of the lower and upper molds 4b and 4a must be changed, and the pitches of the ejector pins 10b and 10a must also be changed. Every time the type of product changes, the lower mold 4b, the upper mold 4a, the heater plates 3b and 3a, the spacers 7b and 7a, and the heat insulators 8b and 8a must be replaced with proper ones. The manufacturing and material costs are increased.

Furthermore, the heater plates 3b and 3a and the spacers 7b and 7a are greater than the lower and upper molds 4b and 4a in size and weight. The replacement operation is time-consuming and cumbersome, and replacement cannot be immediately performed until the apparatus is cooled, since the molding apparatus is heated at a molding temperature, thus resulting in heat loss and low replacement efficiency. As a result, the utilization efficiency of the apparatus using such molds is degraded.

SUMMARY OF THE INVENTION

The present invention has been made in consideration of the above situation, and has for its ojbect to provide a plastic molding apparatus capable of providing a reduced installation cost, a simplified mold replacement operation, and increased utilization efficiency.

In order to achieve the above object of the present invention, there is provided a plastic molding apparatus for molding a semiconductor element with a plastic by using transfer molds, comprising:

upper heater plate;

lower heater plate arranged to be symmetrical with the upper heater plate about said transfer molds and having a plurality of through holes vertically extending therethrough;

upper mold supported through a frame-like spacer on lower surface of the upper heater plate;

lower mold supported through a frame-like spacer on upper surface of said lower heater plate and having a bore extending through a mold cavity thereof;

a first lower ejector plate which is disposed below said lower heater plate to be vertically movable and which is supported by lower support rods respectively extending through said through holes of said lower heater plate;

a second lower ejector plate which is housed in a space defined by said lower heater plate, said lower mold and said lower spacer to be vertically movable, and which is detachably mounted on upper ends of said lower support rods;

lower ejector pins mounted on said second lower ejector plate and capable of extending into said mold cavities through said bores; and means, interlocked with mold clamping by said upper and lower molds, for moving said second lower ejector plate toward said lower heater plate.

DETAILED DESCRIPTION OF THE PREFERRED EMBODIMENTS

A plastic molding apparatus according to an embodiment of the present invention will be described with reference to FIGS. 2 and 3.

Figure 1:
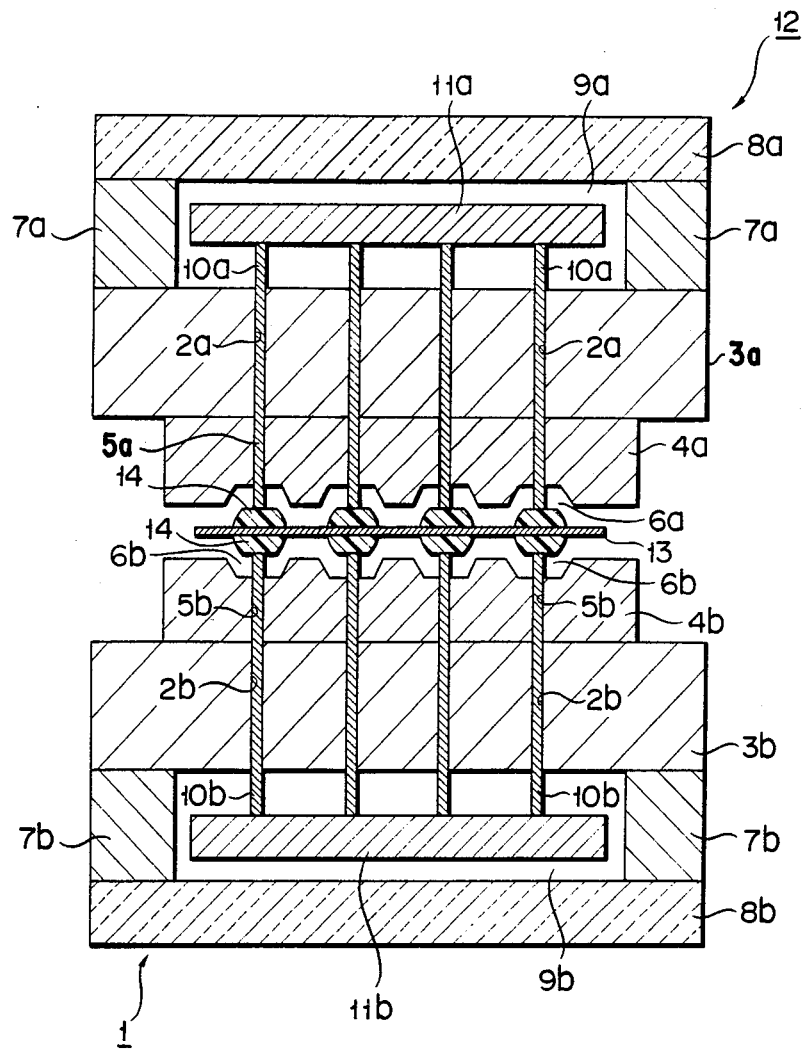
FIG. 1 is a sectional view showing a main part of a conventional semiconductor device plastic molding apparatus.
Figure 2:
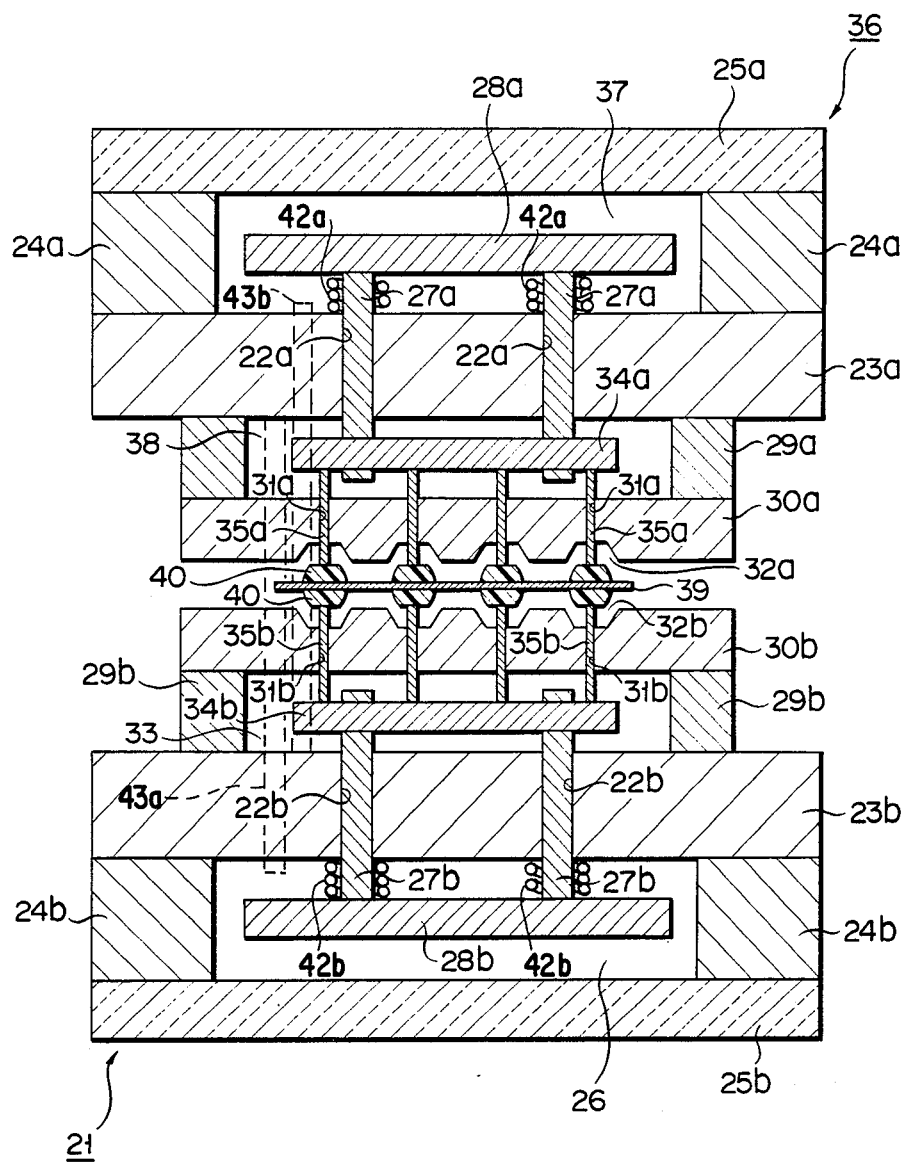
FIG. 2 is a sectional view showing a main part of a semiconductor device plastic molding apparatus according to an embodiment of the present invention.
Figure 3:
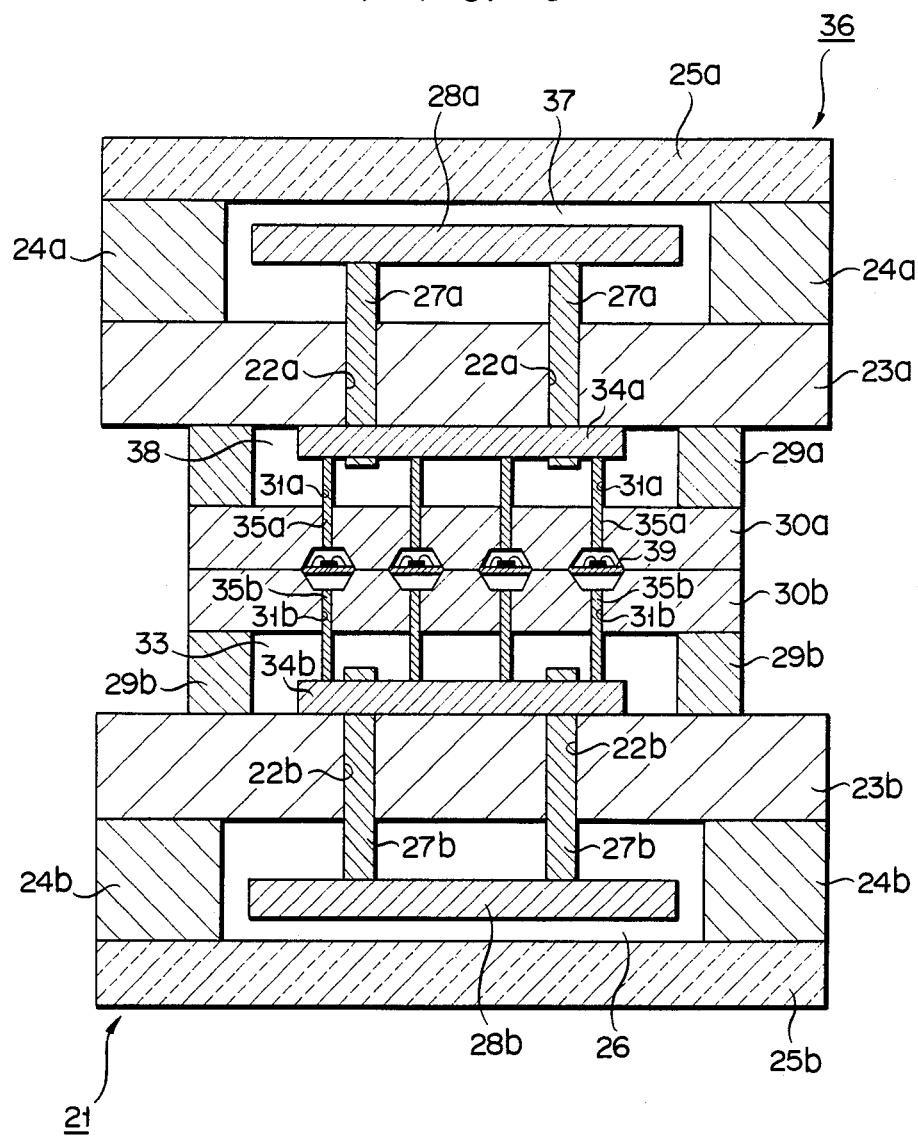
FIG. 3 is a sectional view showing the state wherein mold clamping is performed by the apparatus shown in FIG. 2.

Referring to FIGS. 2 and 3, reference numeral 21 denotes a lower half. The lower half 21 has a lower heater plate 23b provided with, for example, four through holes 22b. A lower heat insulator 25b is disposed through a frame-like first lower spacer 24b below the lower surface of the heater plate 23b. A first lower ejector plate 28b is vertically movable in a space 26 defined by the lower heater plate 23b, the insulator 25b and the spacer 24b. The first lower ejector plate 28b is supported by a plurality of lower support rods 27b respectively inserted in the through holes 22b of the lower heater plate 23b. A lower mold 30b is disposed through a frame-like second lower spacer 29b on the upper surface of the lower heater plate 23b. A plurality of bores 31b are formed in the lower mold 30b. A plurality of openings (or mold cavities) 32b are formed in upper surface portions of the lower mold 30b which respectively correspond to the bores 31b. A second lower ejector plate 34b is vertically movable in a space 33 defined by the lower heater plate 23b, the lower mold 30b and the second lower spacer 29b. The second lower ejector plate 34b is detachably mounted on the distal ends of the support rods 27b. A plurality of lower ejector pins 35b are mounted on the upper surface of the ejector plate 34b so as to be freely extended into or withdrawn from the openings 32b through the bores 31b, respectively. The upper surface of the first lower ejector plate 28b and the lower surface of the heater plate 23b are coupled by a coil spring 42(b) for normally biasing the second lower ejector plate 34b toward the lower mold 30b. Furthermore, an upper push rod 43(a) vertically extends downward from the upper heater plate of an upper half (to be described later) and abuts against the upper surface of the first lower ejector plate 28b. The upper push rod urges the ejector plate 28b downward against the biasing force of the coil spring.

Reference numeral 36 denotes an upper half which is symmetrical with the lower half 21 and which is vertically movable relative to the lower half 21. The upper half 36 has an upper heater plate 23a provided with, for example, four through holes 22a. An upper heat insulator 25a made of, for example, mica, is disposed through a frame-like first upper spacer 24a on the upper surface of the heater plate 23a. A first upper ejector plate 28a is vertically movable in a space 37 defined by the upper heater plate 23a, the insulator 25a and the spacer 24a. The first upper ejector plate 28a is supported by a plurality of upper support rods 27a inserted in the through holes 22a of the upper heater plate 23a. An upper mold 30a is disposed through a frame-like second upper spacer 29a below the lower surface of the upper heater plate 23a. A plurality of bores 31a are formed in the upper mold 30a. A plurality of openings (or mold cavities) 32a are formed in lower surface portions of the upper mold 30a which respectively correspond to the bores 31a. A second upper ejector plate 34a is vertically movable in a space 38 defined by the upper heater plate 23a, the upper mold 30a and the spacer 29a. The second upper ejector plate 34a is detachably mounted on the distal ends of the support rods 27a. A plurality of upper ejector pins 35a are mounted below the lower surface of the ejector plate 34a so as to be freely extended into or withdrawn from the openings 32a through the bores 31a, respectively. The lower surface of the first upper ejector plate 28a and the upper surface of the heater plate 23a are coupled by a coil spring 42(a) for normally biasing the second upper ejector plate 34a toward the upper mold 30a. Furthermore, a lower push rod 43(b) vertically extends upward from the lower heater plate of the lower half 36 and abuts against the lower surface of the first upper ejector plate 28a. The lower push rods urges the ejector plate 28a upward against the biasing force of the coil spring.

Pots, runners and gates (not shown) for injecting a plastic into the openings 32b of the lower mold 30b and the openings 32a of the upper mold 30a are disposed in the upper and lower molds 30a and 30b.

FIG. 2 shows the state wherein semiconductor devices on a lead frame 39 are molded by the plastic and cooled, the upper and lower molds are separated from each other, and the molded semiconductors are vertically clamped between the upper and lower ejector plate pins 35a and 35b, respectively.

The operation of the plastic molding apparatus shown in FIG. 2 will be described with reference to FIGS. 2 and 3.

The lead frame 39 is mounted such that the semiconductor elements thereon are fitted in respective mold cavities of the lower mold 30b of the lower half 21.

When the upper half 36 is moved downward, the upper push rod urges and moves the lower ejector plate 28b downward against the biasing force of the coil spring coupled between the lower heater plate 23b and the first lower ejector plate 28b. The second lower ejector plate 34b is also moved downward, so that the lower ejector pins 35b are moved in the same direction (downward). At the same time, the lower push rod urges and moves the first upper ejector plate 28a and hence the second upper ejector plate 34a against the biasing force of the coil spring coupled between the upper heater plate 23a and the first upper ejector plate 28a. Therefore, the upper ejector pins 35a are moved in the same direction (upward). As a result, mold clamping is performed (FIG. 3).

The plastic is injected into the mold cavities 32a and 32b through the pots, runners and gates, so that the semiconductor elements (not shown) mounted on the lead frame 39 are molded by plastic layers 40.

Thereafter, when the upper half 36 is separated from the lower half 21, the urging force of the upper push rod acting on the first lower ejector plate 28a is released, so that the lower ejector plate 28b is moved upward by the biasing force of the coil spring coupled between the lower heater plate 23b and the lower ejector plate 28b. At the same time, the second lower ejector plate 34b mounted on the distal ends of the lower support rods 27b of the first lower ejector plate 28b is moved upward. The lower ejector pins 35b inserted in the bores 31b extend upward from the bottom surfaces of the openings 32b of the lower mold 30b, respectively. At the same time, the urging force of the lower push rod acting on the first upper ejector plate 28a is released, so that the upper ejector plate 28a is moved downward by the biasing force of the coil spring coupled between the upper heater plate 23a and the upper ejector plate 28a. The second upper ejector plate 34a mounted on the distal ends of the upper support rods 27a of the upper ejector plate 28a is also moved downward, so that the upper ejector pins 35a inserted in the bores 31a extend downward from the bottom surfaces of the openings 32a of the upper mold 30a. As shown in FIG. 2, the lead frame 39 which is plastic-molded is released and separated from the upper and lower halves 36 and 21.

According to the plastic molding apparatus having the construction described above, the second lower and upper ejector plates 34b and 34a which have lower and upper ejector pins 35b and 35a for ejecting the plastic layers 40 (formed on the lead frame 39) from the lower and upper molds 30b and 30a are detachably coupled to the support rods 27b of the first lower ejector plate 28b and the support rods 27a of the first upper ejector plates 28a, respectively. Even if the shape of the upper and lower molds 30a and 30b and the pitch of the upper and lower ejector pins 35a and 35b are required to be changed in accordance with different types of products, upper and lower molds having a proper shape, and upper and lower ejector plates having upper and lower ejector pins of a proper pitch are used to replace the currently used ones. Unlike the conventional apparatus, the heater plates, the bases, and the heat insulators need not be replaced. Therefore, the molding and material costs can be reduced.

Furthermore, the upper and lower molds 30a and 30b and the second upper and lower ejector plates 34a and 34b are compact in size and light in weight, as compared with the upper and lower heater plates 23a and 23b. Therefore, component part replacement can be easily performed. In addition to this advantage, even if the apparatus is heated, it need not be cooled for replacement, thereby decreasing energy loss occurring at the time of heater plate replacement, and improving the utilization efficiency of the apparatus.

Figure 4:
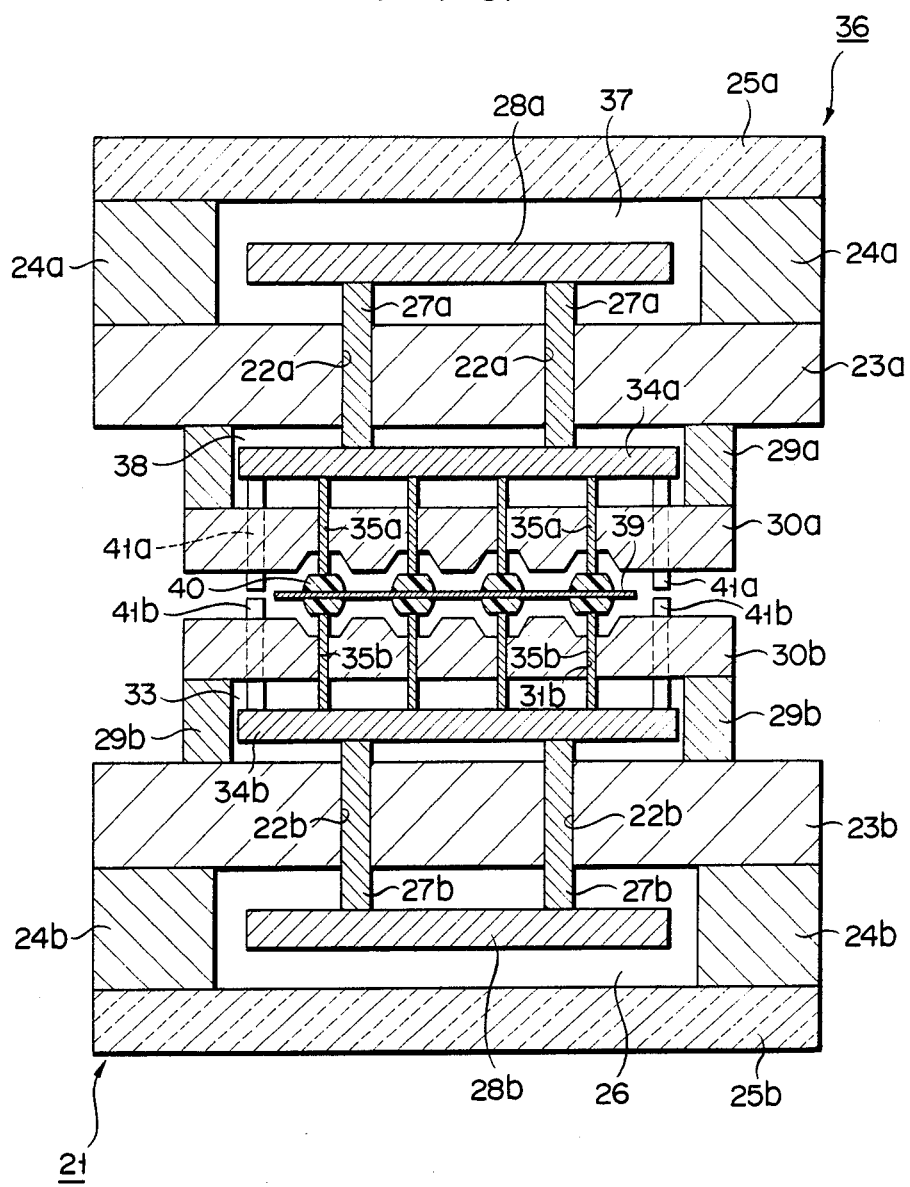
FIG. 4 is a sectional view showing a main part of a semiconductor device plastic molding apparatus according to another embodiment of the present invention.

FIG. 4 shows another embodiment of the present invention. Unlike the first embodiment wherein the upper and lower push rods for withdrawing the ejector pins 35a and 35b respectively extend within the upper and lower heater plates 23a and 23b so as to urge the second upper ejector plate 34a upward and the second lower ejector plate 34b downward, respectively, these push rods in the embodiment in FIG. 4 are mounted and extend from the second upper and lower ejector plates 34a and 34b, and their distal ends abut against each other at the opposing surfaces of the lower and upper molds 30b and 30a so as to withdraw the ejector pins 35a and 35b, respectively.

As shown in FIG. 4, upper push rods 41a are mounted on and extend downward from the edge portion of the lower surface of the second upper ejector plate 34a. Similarly, lower push rods 41b are mounted on and extend upward from the edge portion of the upper surface of the second lower ejector plate 34b. The upper push rods 41a abut against the lower push rods 41b at the opposing surfaces of the upper and lower molds 30a and 30b in synchronism with mold clamping, while the upper and lower push rods 41a and 41b extend through the upper and lower molds 30a and 30b, respectively. As a result, the ejector pins 35a and 35b can be withdrawn from the mold cavities, respectively.

In this case, the distal ends of the upper and lower support rods 27a and 27b need not be fixed on the second ejector plates 34a and 34b, respectively. The distal ends may be arranged to be brought into contact with the second ejector plates 34a and 34b, respectively.

In the second embodiment shown in FIG. 4, any other construction is the same as that of the embodiment shown in FIGS. 2 and 3. The same reference numerals denote the same members throughout FIGS 2 to 4, and a detailed description thereof has been omitted.

According to the present invention as described above, there is provided a plastic molding apparatus capable of reducing the installation cost, reducing the need for replacement of component parts, and improving the utilization efficiency of the apparatus.

In the above embodiments, a means to move the upper ejector pins through the second upper ejector plate is provided for ejecting a molded product. However, the ejection of the molded product may be apparently carried out without providing such a means in the upper half of the molding apparatus. Accordingly provisions of through holes 22a in the upper heater plate, a bore 31a in a mold cavity, a first and a second upper ejector plates 28a, 34a and a means 41a to move the second upper ejector plate 34a may be omitted.

What is claimed is:

1. A plastic molding apparatus for molding semiconductor elements on a frame, comprising:
   upper and lower heater plates symmetrically disposed about said frame, said lower heater plate having a plurality of apertures extending substantially perpendicular to said frame;
   upper and lower molds mounted between said heater plates for movement therewith, said lower mold having bores and molding cavities, said bores being connected individually to each of said mold cavities;
   first spacer means for rigidly connecting said upper heater plate to said upper mold;
   second spacer means for rigidly connecting said lower heater plate to said lower mold;
   lower support rods extending through and being individually slidable within said apertures of said lower heater plate;
   a first lower ejector plate connected at one end of said rods and being movable therewith;
   a second lower ejector plate detachably connected at an opposite end of said rods and being movable with said first lower ejector plate;
   lower ejector pins mounted on said second lower ejector plate and extending individually through each of said bores, said lower ejector pins and said lower support rods being movable together with said lower ejector plates; and
   means for movably positioning said second lower ejector plate toward said heater plate.

2. The apparatus as defined in claim 1, wherein said means for movably positioning said second lower ejector plate include:
   upper push rods extending downward from said upper heater plate and distal ends abutting said first lower ejector plate, said upper push rods forcing said first lower ejector plate away from said lower heater plate; and
   spring means for biasing said second lower ejector plate toward said lower mold.

3. The apparatus as defined in claim 1, wherein said means for movably positioning said second lower ejector plate include:
   lower drive rods having second proximal ends, and second distal ends, said second proximal ends being affixed to said second lower ejector plate, said lower drive rods being slidably positioned within said lower mold; and upper drive rods being slidably positioned within said upper mold and abutting said second distal ends to position said lower ejector pins within said mold cavity.

4. A plastic molding apparatus for molding semiconductor elements on a frame, comprising:
   upper and lower heater plates symmetrically disposed about said frame and having a plurality of apertures extending substantially perpendicular to said frame;
   upper and lower molds mounted between said heater plates for movement therewith, said molds having bores and mold cavities, said bores being connected individually to each said mold cavities;
   first spacer means for rigidly connecting said upper heater plate to said upper mold with a first space therebetween;
   second spacer means for rigidly connecting said lower heater plate to said lower mold with a second space therebetween;
   lower support rods extending through and being individually slidable within said apertures of said lower heater plate;
   a first lower ejector plate connected at ends of said lower support rods distant to said frame and being movable with said lower support rods;
   a second lower ejector plate detachably connected within said second space at an opposite end of said lower support rods being movable with said first lower ejector plate;
   upper support rods extending through and being individually slidable within said apertures of said upper heater plate;
   a first upper ejector plate connected at ends of said upper support rods distant from said frame and being movable with said upper support rods;
   a second ejector plate detachably connected within said first space at an opposite end of said upper support rod and being movable with said first upper ejector plate; and
   means for movably positioning said first upper and lower ejector plates in the direction of said upper and lower heater plates, respectively.

5. The apparatus as defined in claim 4, wherein said means for positioning said first upper and lower ejector plates include:
   upper push rods extending downward from said upper heater plate and said first distal ends extending through said first space to abut said first lower ejector plate, said upper push rods forcing said first lower ejector plate away from said lower heater plate;
   lower push rods extending upward from said lower heater plate and second distal ends extending through said second space to abut said first upper ejector plate, said lower push rods forcing said first upper ejector plate away from said upper heater plate; and
   spring means for biasing said second upper and lower ejector plates toward said upper and lower molds.

6. The apparatus as defined in claim 4, wherein said means for movably positioning said first upper and lower ejector plates include:
   lower drive rods having first fixed and first free ends, said first fixed ends being attached to said second lower ejector plate, said lower drive rods being slidably positioned within said lower mold; and
   upper drive rods having second fixed and second free ends, said second fixed ends being attached to said second upper ejector plates, said upper drive rods being slidably positioned within said upper mold, the first and second free ends abutting when said upper and lower ejector pins are positioned within said respective mold cavities.

7. A molding press, which comprises:
   a lower mold having mold cavities extending into bores running through said lower mold;
   an upper mold having mold cavities extending into bores running through said lower mold;
   a lower heater plate means mounted in spaced relation on said first mold, said first heater plate means having first apertures extending therethrough;
   an upper heater plate mounted in spaced relation on said second mold, said second heater plate having second apertures extending therethrough;

a first lower ejector plate positioned beneath said lower heater plate;

a first upper ejector plate positioned above said upper heater plate;

a second lower ejector plate positioned in the space between said lower mold and said lower heater plate;

a second upper ejector plate positioned in the space between said upper mold and said upper heater plate;

first support rods extending through said first apertures and coupled at opposite ends to said first and second lower ejector plates;

second support rods extending through said second apertures and coupled at opposite ends to said first and second upper ejector plates;

lower ejector pins mounted on said second lower ejector plate to extend through said first bores into said mold cavities;

upper ejector pins mounted on said second upper ejector plate to extend through said second bores into said second mold cavities;

lower spring means acting on said first lower ejector plate for urging said lower ejector plate to withdraw said ejector pins into said lower mold cavities;

upper spring means acting on said first upper ejector plate for urging said first upper ejector plate to withdraw said upper ejector pins into said upper mold cavities;

an upper push rod extending from the upper heater plate and abutting said first lower ejector plate for urging said first lower ejector plate against the action of said lower spring means to withdraw the first lower ejector pins into said lower mold cavities when the mold is closed; and a lower push rod extending from the lower heater plate and abutting said first upper ejector plate for urging said second upper ejector plate against the action of said upper spring means to withdraw the second lower ejector pins into said upper mold cavities when the mold is closed.

* * * * *